United States Patent [19]

Hughes, Jr. et al.

[11] Patent Number: 5,229,668
[45] Date of Patent: Jul. 20, 1993

[54] METHOD AND APPARATUS FOR HIGH SPEED DIGITAL SAMPLING OF A DATA SIGNAL

[75] Inventors: Thomas A. Hughes, Jr., Raleigh; Carl T. Gray, Cary; Wentai Liu, Cary; Ralph K. Cavin, III, Cary, all of N.C.

[73] Assignee: North Carolina State University of Raleigh, Raleigh, N.C.

[21] Appl. No.: 857,457

[22] Filed: Mar. 25, 1992

[51] Int. Cl.[5] .................. H03K 5/13; H03K 5/159
[52] U.S. Cl. ........................ 307/605; 307/606; 328/63
[58] Field of Search ............... 328/56, 63, 150; 307/606, 605

[56] References Cited

U.S. PATENT DOCUMENTS

| | | | |
|---|---|---|---|
| 4,620,180 | 10/1986 | Carlton | 328/56 |
| 4,929,850 | 5/1990 | Breuninger | 307/269 |
| 5,012,141 | 4/1991 | Tomisawa | 307/594 |
| 5,122,694 | 6/1992 | Bradford et al. | 307/269 |

OTHER PUBLICATIONS

*A High Speed CMOS FIFO Using Wave Pipelining*, C. T. Gray, T. Hughes, D. Fan, G. Moyer, W. Liu, R. Cavin, III, Department of Electrical and Computer Engineering, NCSU-VLSI-91-01, Jan. 1991, pp. 1-25.

*Advantages of MCM Technology for CMOS Wave Pipelined Systems*, T. Hughes, T. Gray, W. Farlow, W. Liu, R. Cavin, Dept. of Electrical and Computer Engineering, 1991 Multichip Module Workshop Extended Abstract vol., Mar. 1991, pp. 33-39.

*Theoretical and Practical Issues in CMOS Wave Pipelining*, C. T. Gray, T. Hughes, S. Arora, W. Farlow, D. Fan, W. Liu, R. Cavin, III, Dept. of Electrical and Computer Engineering, NCSU, VLSI 91, Aug., 1991.

*A 320-MHz Hybrid Analog/Digital Clock Recovery Circuit in 2-μm CMOS*, B. Kim, D. N. Helman, P. R. Gray, IEEE Journal of Solid-State Circuits, vol. 25, No. 6, Dec. 1990, pp. 1385-1394.

*CMOS ASIC Devices for the Measurement of Short Time Intervals*, T. Rahkonen et al., ISCAS 1988, pp. 1593-1596.

*Time Interval Measurements Using Integrated Tapped CMOS Delay Lines*, T. Rahkonen et al., IEEE 1990, pp. 201-205.

Pulsewidth Measurements Using an Integrated Pulse Shrinking Delay Line, T. Rahkonen et al., IEEE 1990, pp. 578-580.

*Automatic Gain Control Electronics for Fast Pulsed Time-of-Flight Laser Rangerfinding*, M. Koskinen et al., ISA, 1989, pp. 295-303.

*A CMOS ASIC Time-to-Digital Converter for Short Time Interval Measurements*, T. Rahkonen et al., ISCAS, IEEE 1989, pp. 2092-2095.

*A Time-of-Flight Laser Sensor for Sheet Flutter Analysis*, M. Koskinen et al., ISA, 1989, pp. 305-317.

*Primary Examiner*—Jin F. Ng
*Assistant Examiner*—Sinh Tran
*Attorney, Agent, or Firm*—Bell, Seltzer, Park & Gibson

[57] ABSTRACT

A data signal may be sampled at high speed using a clock signal by propagating the data signal and the clock signal through a series of data and clock delay elements, respectively, and latching the corresponding delayed data and clock signals. The sampling speed is thereby controlled by the relative skew between the clock and data signals, which can be made relatively small and may be limited only by noise and random variations in fabrication. Accordingly, high speed sampling may be obtained.

7 Claims, 3 Drawing Sheets

METHOD AND APPARATUS FOR HIGH SPEED DIGITAL SAMPLING OF A DATA SIGNAL

FIELD OF THE INVENTION

This invention relates to processing of digital signals and more particularly to sampling of digital data signals.

BACKGROUND OF THE INVENTION

Many digital systems require high speed sampling of digital data signals. For example, in digital logic analyzers, digital phase locked loops (DPLL) and data and clock recovery circuits, there is a need to perform high speed sampling of digital data signals.

Sampling of digital signals is typically accomplished by applying the digital data signal to the input of a single latch which is clocked by a high speed clock. The output of the latch provides a sample of the value of the data signal each time a clock pulse is applied.

Unfortunately, there are limitations on the sampling rate or sampling frequency which is possible using a clocked latch. These limitations typically arise because of the inherent delay of the latch, including the latch set up time before the clock edge, the latch hold time after the clock edge, and the latch delay time in propagating a signal through the latch. Sampling rate may be increased by increasing the clock speed and/or minimizing the delays in the latch through use of higher speed technologies and circuit techniques. However, designs with higher speed clocks and higher speed technologies are generally more expensive.

Another technique for sampling of digital signals is described in a publication entitled *A 30-MHz Hybrid Analog/Digital Clock Recovery Circuit in 2-μm CMOS* by Kim et al., published in the IEEE Journal of Solid State Circuits, Vol. 25, No. 6, pages 1385-1393, December, 1990. A clock signal is propagated through a series of delay elements, and a tap after each delay element connects to the clock input of a corresponding latch. The data signal is connected to all the data inputs of the latches. The sampling rate is related to the delay between successive taps, which is typically determined by the delay of one or two inverters.

SUMMARY OF THE INVENTION

It is therefore an object of the present invention to provide a method and apparatus for sampling a signal at high speed.

It is another object of the present invention to provide a method and apparatus for sampling a digital signal at a frequency which is higher than the clock frequency.

It is yet another object of the invention to provide a method and apparatus for high speed sampling of a signal, at a sampling interval which is smaller than the inherent gate delay of the technology being used.

These and other objects are provided according to the present invention by simultaneously propagating a data signal and a clock signal through a series of data and clock delay elements, respectively, and latching the corresponding delayed data and clock signals. The sampling rate is thereby controlled by the relative skew i.e. the difference or offset between the clock and data signals. The relative skew between the clock and data signals can be made relatively small, and may be limited only by noise and random variations in fabrication. Accordingly, high sampling rates may be provided.

In particular, the data signal may be repeatedly delayed by a first relatively long delay to produce a series of delayed data signals. The clock signal may also be repeatedly delayed by a second relatively long delay to produce a corresponding series of delayed clock signals. The difference between the first relatively long delay and the second relatively long delay may be made relatively small, to produce relatively small skew or offset between the corresponding ones of the delayed data signals and the delayed clock signals. Each of the series of delayed data signals may be latched, using the corresponding one of the series of delayed clock signals, to produce samples of the data signals at a sampling rate which is determined by the relatively small skew between corresponding ones of the delayed data signals and delayed clock signals.

A system according to the present invention may include a plurality of data delay elements each of which has an input and an output, with the data delay elements being serially connected such that the output of an immediately preceding data delay element is connected to the input of an immediately succeeding data delay element, and the data signal is connected to the input of the first data delay element. A corresponding plurality of clock delay elements may be provided, each of which has an input and an output, with the clock delay elements being serially connected such that the output of an immediately preceding clock delay element is connected to the input of an immediately succeeding clock delay element, and the clock signal is connected to the input of the first clock delay element. Each data delay element and clock delay element produces a relatively long delay, with the delay of the data delay elements being different from the delay of the clock delay elements.

A corresponding plurality of latches is also provided, with each latch having a data input, a data output and a clock input. The data input of a respective latch is connected to the output of a respective data delay element, and the clock input of a respective latch is connected to the output of a respective clock delay element. Accordingly, data is latched into each latch at a speed determined by the relatively small skew between the data delay elements and the clock delay elements.

The relative skew between the data elements and clock elements may be an order of magnitude lower than the delay times of each of the elements, and orders of magnitude lower than the clock period. For example, a sampling interval (i.e. the reciprocal of the sampling rate or sampling frequency) of 100 picoseconds is achievable in one-micron CMOS technology with 500 picosecond inverter gate delays and even slower latches. The clock speed can be much lower than the sampling rate. Such sampling rates would not appear to be possible in this technology with a single latch sampler, due to the need for a 10 GHz clock rate. This sampling interval would also not appear to be possible with prior art samplers having a multi-tap delay only for the clock path, since the minimum size delay element is greater than 100 picoseconds.

In a preferred embodiment of the present invention the latches are edge triggered D-type flip-flops, with each of the data delay elements and clock delay elements being at least one inverter. Biased inverters may be used, with the inverter bias determining the amount of delay. The amount of delay in the data path and/or in the clock path may be varied or controlled to set the sampling interval. The amount of delay can also be varied for individual inverters to compensate for process variations within the integrated circuit chip.

The present invention may be used to sample a digital data signal at high speed. If the digital data signal is a serial communication signal, sampling according to the present invention may be used to perform data and clock recovery, as well as time-division demultiplexing.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
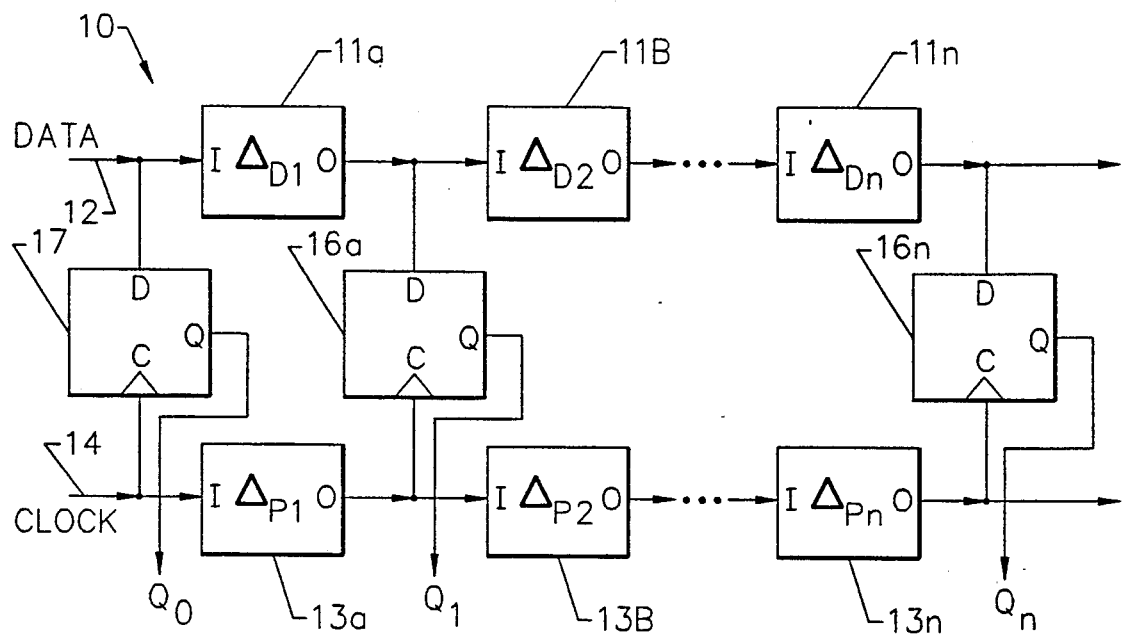
FIG. 1 illustrates a schematic block diagram of a system for processing a data signal and a clock signal according to the present invention.

Referring now to FIG. 1, a system 10 for processing a data signal 12 and a clock signal 14 will now be described. It will be understood by those having skill in the art that the term "data signal" refers to any signal to be sampled, and that data signal itself may be a clock signal to be sampled. The data signal may also be a serial communication signal, wherein sampling can also perform data and clock recovery, as well as time division demultiplexing.

The system 10 includes a plurality of data delay elements $11a \ldots 11n$ each of which includes an input I and an output O and which are serially connected such that an output of an immediately preceding data delay element is connected to the input of an immediately succeeding data delay element, with the data signal 12 connected to the input of the first data delay element $11a$. Each data delay element $11a \ldots 11n$ provides a corresponding delay $\Delta_{D1} \ldots \Delta_{Dn}$ between the input and output thereof. As also shown in FIG. 1, the system includes a corresponding plurality of clock delay elements $13a \ldots 13n$, each having an input I and an output O, and which are serially connected so that the output of an immediately preceding clock delay element is connected to the input of an immediately succeeding clock delay element, with the clock signal 14 connected to the input of the first clock delay element $13a$.

Still referring to FIG. 1, a corresponding plurality of latches $16a \ldots 16n$ is provided, with each latch having a data input D, a clock input C and an output Q. As shown, the data input D of a respective latch 16 is connected to the output O of a respective data delay element 11, and the clock input C of a respective latch 16 is connected to the output O of a respective clock delay element 13. An input latch 17 is also provided, with the data signal 12 being connected to the data input D of input latch 17 and the clock signal 14 being connected to the clock input C of input latch 17. The outputs $Q_0 \ldots Q_n$ of the latches 17 and $16a \ldots 16n$ provide high resolution samples of data signal 12 using clock 14. Latches 16 and 17 are preferably D-type, edge triggering flip-flops.

Preferably, each delay element 11 provides the same delay $\Delta_D$ and each clock delay element 13 provides the same delay $\Delta_P$, with $\Delta_D$ not being equal to $\Delta_P$. The sampling interval or sampling step is determined by the difference between $\Delta_D$ and $\Delta_P$, with the sampling rate or sampling frequency being the reciprocal of the sampling interval. Accordingly, $\Delta_D$ and $\Delta_P$ may be made relatively long but skewed or offset relative to one another, so that the difference between $\Delta_D$ and $\Delta_P$ is relatively small. Since the sampling interval is determined by the relatively small skew between data delay elements 11 and clock delay elements 13, high sampling rates may be obtained. Preferably, the data delay is shorter than the clock delay, although the clock delay may also be shorter than the data delay.

Figure 2:
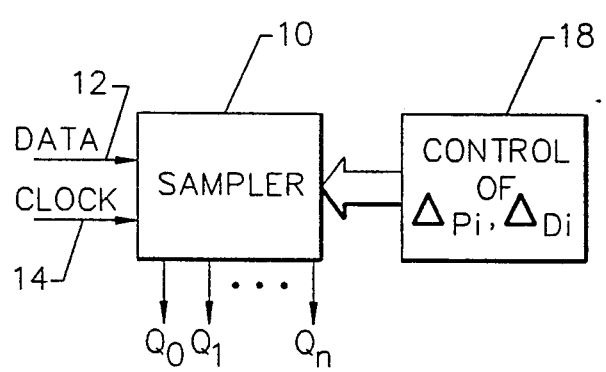
FIG. 2 illustrates a schematic representation of the system of FIG. 1.

FIG. 2 illustrates a schematic representation for system 10 of FIG. 1, including data input 12, clock input 14 and sampled outputs Q1 . . . Qn. As also shown in FIG. 2, a controller 18 may be provided for controlling the amount of delay for each data delay element 11 and clock delay element 13. The controller may equalize the delays among the data delay elements 11, and equalize the delays among the clock delay elements 13, notwithstanding process and other variations, as will be described in detail below.

Accordingly, high sampling frequency is achieved by simultaneously propagating both data signals and clock signals through delay elements as waves in one direction. The sampling frequency is thus controlled by the relative skew between the clock and data waves. The amount of relative skew can be arbitrarily small, limited only by random variations in fabrication, to thereby produce high speed for real time sampling.

It will be understood by those having skill in the art that the present invention may be regarded as an application of a "wave pipelining" technique for both data and clock signals. Wave pipelining has heretofore been used to design high speed, CMOS logic circuits. See, for example, the publication entitled "Advantages of MCM Technology for CMOS Wave Pipeline Systems" by coinventor Hughes et al., 1991 Multichip Module Workshop March 28-29, March, 1991, pp. 33-39; "Theoretical and Practical Issues in CMOS Wave Pipelining" by coinventor Gray et al., VLSI 91, Aug. 20-22, 1991; and North Carolina State University Technical Report VLSI-91-01 entitled "A High Speed CMOS FIFO Using Wave Pipelining" by coinventor Gray et al., January, 1991, the disclosures of which are all hereby incorporated herein by reference. As shown in these publications, wave pipeline systems may be used to apply new inputs to combinational logic before the previous results are available. In this manner, the combinational logic is effectively pipelined with multiple coherent "waves" of data present at various stages of the logic block. The minimal clock period at which new inputs can be applied to the combinational logic is, in the ideal case, limited only by the difference in the delay times of the maximal and minimal paths through the logic. Thus, clock frequencies can be maximized when logic delay paths are equalized. However, to the best of the inventors' knowledge, wave pipelining has not been heretofore used for high speed sampling circuits.

A quantitative explanation of the present invention will now be provided. Consider the sampling that occurs due to an edge in clock signal 14 at time $T_0$. The corresponding edge at the output of the first clock delay element is at time $T_1 = T_0 \Delta_{P1}$. In general, the edge of the input of the $i^{th}$ clock delay at time $T_{i-1}$ will appear at the output of the $i^{th}$ clock delay at time $T_i = T_{i-1} + \Delta_{Pi}$.

Data signal 12 may be denoted as a function of time $D_0(t)$. The signal of the output of the first data delay element is $D_1(t) = D_0(t + \Delta_{D1})$. In general, the signal at the input of the $i^{th}$ data delay is given by $D_i(t)$, and the signal at the output of the $i^{th}$ data delay is given by $D_{i+1}(t) = D_i(t + \Delta_{Di})$. At time $T_i$, i is latched with a clock edge at its clock input C, and $D_i(t)$ at its data signal D has the value $D_i(t_i)$ at its output Q a short time after $T_i$. The effect of the data delay and clock delay may be expressed as:

$$Q_i = D_i(T_i) \quad (1)$$

$$Q_i = D_i(T_{i-1} + \Delta_{Pi}) \text{ and} \quad (2)$$

$$Q_i = D_{i-1}(T_{i-1} + \Delta_{Pi} - \Delta_{Di}). \quad (3)$$

Since $$Q_{i-1} = D_{i-1}(T_{i-1}), \quad (4)$$

The sampling interval between latch i and latch i−1 is:

$$\Delta_{Pi} - \Delta_{Di} = \Delta_{PDi}. \quad (5)$$

If for all i, $\Delta_{Di} = \Delta_D$ and $\Delta_{Pi} = \Delta_P$, then, at every stage, the time difference between data and clock delay elements is a constant, $\Delta_{PD} = (\Delta_P - \Delta_D)$. Accordingly, $Q_i = D(P + i\Delta_{PD})$. Thus, samples can be taken at intervals of $\Delta_{PD}$. The sample interval or sampling step, $\Delta_{PD}$, can be arbitrarily small, as it is the difference between $\Delta_P$ and $\Delta_D$, each of which can be larger than $\Delta_{PD}$. Accordingly, the sampling rate or sampling frequency (the reciprocal of sampling interval or sampling step) is independent of the clock rate applied to the system. In other words, unlike existing techniques, a fast clock and fast latches are not needed.

It will be understood by those having skill in the art that the circuit elements 11, 13 and 16 may also have limitations as to maximum frequency of data. For example, the delay elements 11 and 13 act as low pass filters. Also, the latches 16 and 17 act as low pass filters at the D input. Accordingly, a sufficiently short pulse on the D input cannot be latched for any waveform of the clock. Therefore, the effective low pass filters result in a maximum useful bandwidth of the sampling circuit. Thus, the minimum observable pulse width is 1/(maximum useful bandwidth). Pulses larger than the minimum observable pulse can be recorded by the sampling circuit, while pulses shorter than the minimum observable pulse width cannot. The sampling rate can be much higher than the maximum useful bandwidth, which is believed to be a unique advantage of the present invention.

Figure 3:
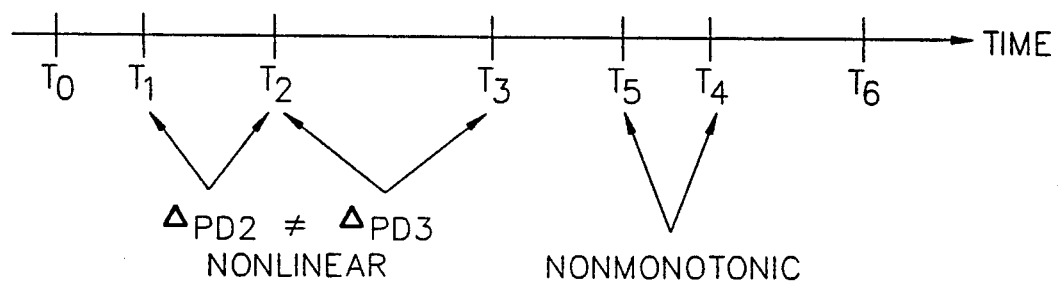
FIG. 3 graphically illustrates nonlinear and non-monotonic sampling which may result from process, environmental or other variations in the system of FIG. 1.

It will also be understood by those having skill in the art that in an integrated circuit it may be difficult to make each data delay element 11 produce equal delay and to make each clock delay, element 13 produce equal delay, because of manufacturing process and environmental variations. Inequalities among $\Delta_{PD}$ results in nonlinearity in the sampled data. If some $\Delta_{PD}$ are negative while other $\Delta_{PD}$ are positive, the sampled data is not monotonic in time. FIG. 3 graphically illustrates nonlinear and nonmonotonic sampling which may result from process, environmental and other variations.

There are many sources for delay variations, especially considering the high frequencies at which the present invention may operate. These sources may be categorized into two major groups: static variations such as those due to fabrication processes, and dynamic operational variations such as those due to temperature changes and noise.

Static variations refer to the inevitable processing variations that occur between chips of different fabrication runs, between chips at different locations on the same wafer and between different devices on the same chip. Slight variations of channel lengths of fabricated devices can produce variations in the nominal delay of the elements of the present invention. Dynamic variations are caused by the variation in gate delay induced by changes in the operating environment, such as the temperature of the device, noise and power fluctuations. These variations cause the delay $\Delta_D$ of the data delay elements 11 and the delay $\Delta_P$ of the clock delay elements 13 to change over time.

In order to reduce the effect of these changes the system of the present invention may be designed so that these changes do not affect the circuit operation, as described below. Alternatively, these changes may be controlled via feedback or the changes may be measured and adjustments may be made to the sampled data, as described below.

The system may be designed to operate notwithstanding these changes by making $\Delta_{PD}$ large enough to ensure that it is always positive, thereby ensuring monotonicity. The remaining nonlinearities in sampling may be tolerated. Alternatively, each $\Delta_{PDi}$ may be adjusted after the chip is fabricated, or during operation of the sampling circuit, to make all of the $\Delta_{PD}$ equal. A technique for providing a biased CMOS inverter to accomplish this will be described below. Finally, the $\Delta_{PD}$ for each stage may be measured and the sampled data may be post-processed at the outputs Q of the latches 17, to compensate for nonmonotonicity and nonlinearity.

Figure 4A:
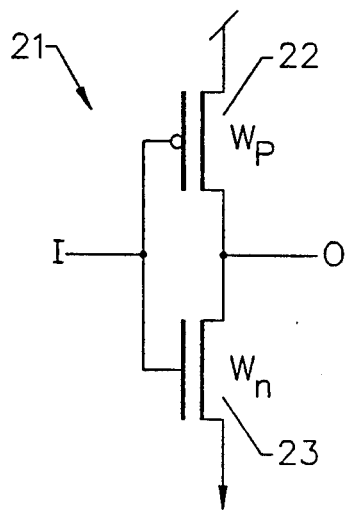
FIGS. 4A and 4B illustrate a circuit diagram and a schematic representation, respectively, for a static CMOS inverter.
Figure 4B:
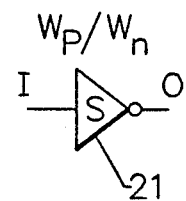

Referring now to FIG. 4A, each of the data delay elements 11 and clock delay elements 13 of FIG. 1 may be implemented using a static CMOS inverter. As is well known to those having skill in the art, a static CMOS inverter may be implemented using a serially connected P-channel FET 22 and N-channel FET 23, the inputs of which are electrically connected together. The ratio of channel width of the P-channel and N-channel FETs ($W_P/W_N$) may be adjusted to obtain the required delay. FIG. 4B illustrates the electronic symbol for the static CMOS inverter of FIG. 4A.

Figure 5A:
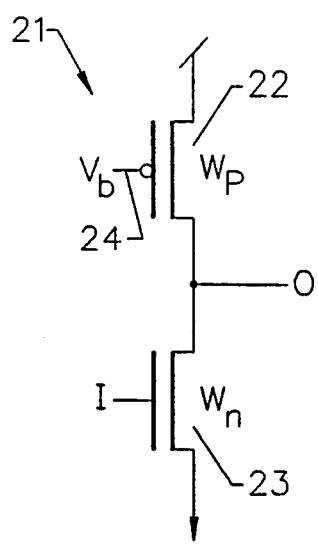
FIGS. 5A and 5B illustrate a circuit diagram and a schematic representation, respectively, for a biased CMOS inverter.
Figure 5B:
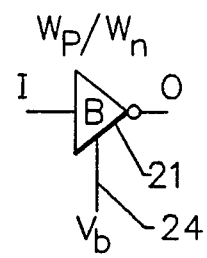

Alternatively, as shown in FIG. 5A, a biased CMOS inverter may be used to provide a programmable delay for each delay element, and thereby compensate for process variations. As shown in FIG. 6A, the biased inverter 21 includes a pair of serially connected complementary FETs 22 and 23 with the input signal I applied to the gate of the N-channel FET 23, and a bias input $V_b$ 24 applied to the input of the gate of the P-channel transistor. FIG. 5B illustrates the electronic symbol for the biased CMOS inverter. The biased CMOS inverter may be used as an inverting delay circuit, with the amount of delay being varied by the bias voltage $V_b$.

As shown in FIG. 5, the pull-up path of a conventional static CMOS invertor has been replaced by a single P-channel transistor 22 with its gate connected to a bias voltage $V_b$. This arrangement may be used to eliminate variation in delay associated with static CMOS parallel paths and give post process control of the rise time versus fall time of the gate to compensate for process variations. The control circuitry 18 of FIG. 2 may be used to provide the requisite bias voltages.

It will also be understood by those having skill in the art that in addition to permitting less delay variation and post process control, the biased CMOS inverter also has lower input capacitance, since its inputs are connected only to NMOS transistors. From simulation results, the waveform of the charging/discharging current is smoother than in the static CMOS inverter. Accordingly, biased CMOS inverters have less switching noise.

Figure 6:
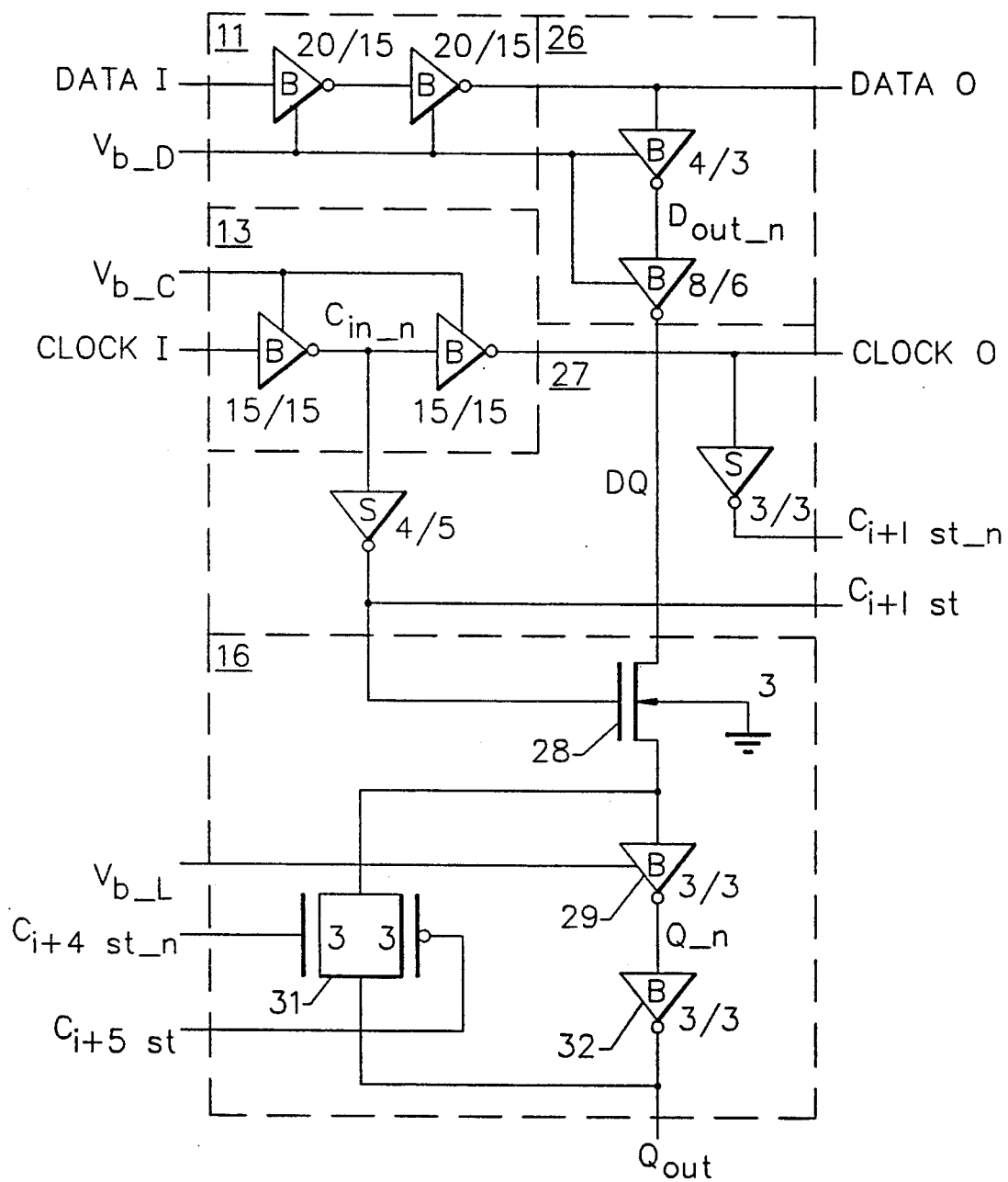
FIG. 6 illustrates a circuit implementation of one stage of the circuit of FIG. 1.

Referring now to FIG. 6, a CMOS implementation of a single stage of the system 10 of FIG. 1 will now be described. As shown, this circuit implementation implements a data delay element 11, a corresponding clock delay element 13 and a corresponding static edge triggered D flip-flop 16. The circuit elements may be replicated to provide the requisite number of stages.

As shown in FIG. 6, the data delay element 11 includes a single biased inverter with a length to width ratio of 20/15. The clock delay element 13 is obtained by delay through two CMOS biased inverters of ratio 15/15. A first buffer 26 comprising a pair of biased inverters, with ratios 4/3 and 8/6 respectively may be used to isolate the latch from the data line, and a second buffer 27 comprising a pair of static inverters of ratios 4/5 and 3/3 respectively, may be used to isolate the clock line from the latch. The second buffer is used to ensure that the same transition edge (leading or trailing edge) of the clock is applied to every D flip-flop. It will be understood by those having skill in the art that the different length-to-width ratios of the inverters in data delay 11 and clock delay 13 cause the clock delay to be slightly greater than the data delay so that $\Delta_{PD}$ has a small positive value.

Still referring to FIG. 6, the D flip-flop 16 is implemented using an N-channel pass transistor 28. A biased inverter 29 is used to set the threshold of the flip-flop by adjusting its bias voltage. Feedback is provided from the output of the biased CMOS inverter 29 to its input through a static inverter 32 and a transmission gate 31. Transmission gate 31 provides a feedback path to make the latch static. The transmission gate is turned on after the pass gate 28 is turned off. Accordingly, an edge-triggered D flip-flop is provided. The inputs to transmission gate 31 are obtained from delayed clock signals from five stages down. This disconnects the feedback path while sampling occurs so that the new data will overwrite the old data present in the latch. After the new data has stabilized, i.e. has propagated through element 32, the feedback path is reconnected to stabilize the data. It will be understood by those having skill in the art that other well known circuit implementations may be used for each of the elements of FIG. 6.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A system for sampling a data signal using a clock signal comprising:

a plurality of data delay elements, each having an input and an output, the data delay elements being serially connected such that the output of an immediately preceding data delay element is connected to the input of an immediately succeeding data delay element, and said data signal is connected to the input of the first data delay element;

a corresponding plurality of clock delay elements, each having an input and an output, the clock delay elements being serially connected such that the output of an immediately preceding clock delay element is connected to the input of an immediately succeeding clock delay element, and said clock signal is connected to the input of said first clock delay element; and a corresponding plurality of edge triggered D-type flip-flops, each having a data input, a data output and a clock input, the data input of the first edge triggered D-type flip-flop being connected to said data signal, the clock input of the first edge triggered D-type flip-flop being connected to said clock signal, the data input of the second edge triggered D-type flip-flop being connected to the output of said first data delay element, the clock input of the second edge triggered D-type flip-flop being connected to the output of said first clock delay element, the data input of a respective edge triggered D-type flip-flop being connected to the output of a respective immediately succeeding data delay element, and the clock input of a respective edge triggered D-type flip-flop being connected to the output of a respective immediately succeeding clock delay element;

wherein each of said data delay elements includes means for producing a first predetermined delay from the input thereof to the output thereof, and wherein each of said clock delay elements includes means for producing a second predetermined delay from the input thereof to the output thereof, wherein said first and second predetermined delays are relatively long, and the difference between said first and second predetermined delays is relatively small; and wherein the data outputs of said plurality of edge triggered D-type flip-flops produce samples of said data signal at intervals determined by the difference between said first predetermined delay and said second predetermined delay.

2. The system of claim 1 wherein said data delay elements and said clock delay elements each comprise at least one inverter.

3. The system of claim 2 wherein at least some of said inverters are biased inverters.

4. The system of claim 3 further comprising means for controlling a bias applied to each of said biased inverters.

5. A method for sampling a data signal at high speed using a clock signal, comprising the steps of:

repeatedly delaying said data signal by a first relatively long delay, to produce a series of delayed data signals;

repeatedly delaying said clock signal by a second relatively long delay to produce a corresponding series of delayed clock signals, with the difference between said first relatively long delay and said second relatively long delay being relatively small, to produce relatively small skew between corresponding ones of said delayed data signals and said delayed clock signals; and latching each of said series of delayed data signals into the data input of an edge triggered D-type flip-flop by applying the corresponding one of said series of delayed clock signals to the corresponding clock input of the edge triggered D-type flip-flop to produce samples of said data signals at a speed determined by the relatively small skew between corresponding ones of said delayed data signals and said delayed clock signals.

6. The method of claim 5 wherein said first relatively long delay is shorter than said second relatively long delay.

7. The method of claim 5 wherein said relative delaying steps comprise the steps of repeatedly delaying and inverting said data signal and said clock signal.

* * * * *